(12) United States Patent
Bryant et al.

(10) Patent No.: US 7,625,691 B2
(45) Date of Patent: Dec. 1, 2009

(54) PHOTOPOLYMER PRINTING FORM WITH REDUCED PROCESSING TIME

(76) Inventors: Laurie A. Bryant, 3589 Vicki La., Douglasville, GA (US) 30135; Jonghan Choi, 256 Ennisbrook Dr., Smyrna, GA (US) 30082

( * ) Notice: Subject to any disclaimer, the term of this patent is extended or adjusted under 35 U.S.C. 154(b) by 273 days.

(21) Appl. No.: 11/289,814

(22) Filed: Nov. 30, 2005

(65) Prior Publication Data

US 2007/0122748 A1    May 31, 2007

(51) Int. Cl.
    *G03F 7/00* (2006.01)
(52) U.S. Cl. .......................................... 430/302
(58) Field of Classification Search ............ 705/7, 705/43; 430/300, 302
    See application file for complete search history.

(56) References Cited

U.S. PATENT DOCUMENTS

| | | | |
|---|---|---|---|
| 3,287,152 A | 11/1966 | Alles et al. | |
| 3,408,191 A | 10/1968 | Jeffers | |
| 4,369,246 A | 1/1983 | Chen et al. | |
| 4,427,759 A | 1/1984 | Gruetzmacher et al. | |
| 4,622,088 A | 11/1986 | Min | |
| 4,927,723 A | 5/1990 | Cusdin | |
| 5,135,827 A | 8/1992 | Bohm et al. | |
| 5,215,859 A | 6/1993 | Martens | |
| 5,370,968 A | 12/1994 | Goss et al. | |
| 5,735,983 A | 4/1998 | Goss et al. | |
| 5,750,315 A | 5/1998 | Rach | |
| 6,403,269 B1 | 6/2002 | Leach | |
| 6,413,699 B1 * | 7/2002 | Kanga | 430/302 |
| 6,691,547 B2 | 2/2004 | Cutshall et al. | |
| 6,759,175 B2 | 7/2004 | Daems et al. | |
| 6,966,259 B2 * | 11/2005 | Kanga et al. | 101/395 |
| 7,081,331 B2 * | 7/2006 | Vest | 430/302 |
| 2002/0058196 A1 | 5/2002 | Kanga | |
| 2002/0120493 A1 * | 8/2002 | Mormile | 705/11 |
| 2004/0067438 A1 | 4/2004 | Fan et al. | |
| 2005/0015297 A1 | 1/2005 | Stebani et al. | |
| 2005/0070997 A1 | 3/2005 | Thornton et al. | |
| 2005/0142480 A1 | 6/2005 | Bode et al. | |
| 2005/0211119 A1 | 9/2005 | Markhart | |
| 2005/0239930 A1 | 10/2005 | St. Clair et al. | |

FOREIGN PATENT DOCUMENTS

| | | |
|---|---|---|
| EP | 0 665 469 | 8/1995 |
| EP | 0 666 505 | 8/1995 |

OTHER PUBLICATIONS http://www.marktrece.com, Dec. 29, 1996.*
"Successfully Preparing and Prosecuting a Business Method Patent Application," presented at AIPLA, Spring 2001, by John J. Love and Wynn W. Coggins.

* cited by examiner

*Primary Examiner*—Cynthia H Kelly
*Assistant Examiner*—Chanceity N Robinson
(74) *Attorney, Agent, or Firm*—Carmody & Torrance LLP

(57) ABSTRACT

The present invention is directed to an improved method of producing photosensitive printing plate blanks comprising the steps of: a) forming a first photocurable layer on a backing sheet; b) curing the first photocurable layer with actinic radiation to create a hard floor layer throughout the first photocurable layer; and c) forming a second photocurable layer on top of the cured first photocured layer that is processible by actinic radiation to form a relief image printing element. The printing plate blank having the precured floor layer may then be delivered to a print shop customer for further processing to produce a relief image printing element.

5 Claims, 3 Drawing Sheets

PHOTOPOLYMER PRINTING FORM WITH REDUCED PROCESSING TIME

FIELD OF THE INVENTION

The present invention is directed to an improved manufacturing method for flexographic printing elements that provides a more uniform floor layer as compared to printing elements of the prior art and to a method of doing business in providing printing plate blanks having a precured floor layer to print shop customers.

BACKGROUND OF THE INVENTION

Flexographic printing elements are commonly used in printing, especially on surfaces which are soft and easily deformed such as packaging materials, including cardboard, plastic films, etc. Flexographic printing elements generally have resilient surfaces that are prepared from elastomeric photocurable resin compositions.

Photocurable (also known as photopolymerizable or photosensitive) resin compositions generally comprise an elastomeric binder (sometimes referred to as a prepolymer or an oligomer), at least one monomer, and a photoinitiator. To prepare relief image printing plate blanks, one or more layers of photocurable material are interposed between a support and one or more cover sheets, including slip and release films that protect the photosensitive surface.

Photocurable printing plate blanks are typically formed by well-known methods including solvent casting, hot pressing, calendaring, and extrusion. Printing plate blanks are then provided to the print shop customer who processes the printing plate blanks through a variety of steps to produce relief image printing element products having the desired properties. Various examples of manufacturing processes can be found in U.S. Pat. No. 5,135,827 to Bohm et al., in U.S. Pat. No. 5,735,983 to Goss et al., and in U.S. Pat. No. 4,622,088 to Min, the subject matter of each of which is herein incorporated by reference in their entirety.

FIG. 3 depicts a typical prior art manufacturing process for producing photosensitive printing plate blanks. A photocurable resin composition is extruded through an extrusion die 40 and is calendared between two flexible supports. The printing blank is then cooled (e.g., to a temperature of about 170° F.) and processed through a thickness profiler 42. Thereafter, the printing plate blank is processed in a forced air cooling device 50 and is transported on a conveyor. Printing plate blanks are then cut to the desired size and are provided to a print shop customer for processing to make the desired relief image printing element.

In the print shop, processing steps for forming relief image printing elements typically include the following:
1) Image generation, which may be mask ablation for digital "computer to plate" plates or negative production for conventional analog plates;
2) Back exposure to create a floor layer in the photocurable layer and establish the depth of relief;
3) Face exposure through the mask or negative to selectively crosslink and cure portions of the photocurable layer not covered by the mask or negative, thereby creating the relief image;
4) Developing to remove unexposed photopolymer by solvent (including water) or thermal development; and
5) If necessary, post exposure and detackification.

Removable coversheets are typically provided to protect the photocurable printing element from damage during transport and handling. Prior to processing the printing elements, the coversheet(s) are removed and the photosensitive surface is exposed to actinic radiation in an imagewise fashion. Upon imagewise exposure to actinic radiation, polymerization, and hence, insolubilization of the photopolymerizable layer occurs in the exposed areas. Treatment with a suitable developer (or thermal development) removes the unexposed areas of the photopolymerizable layer, leaving a printing relief that can be used for flexographic printing.

Back exposure is a blanket exposure to actinic radiation of the photopolymerizable layer on the side opposite that which does, or ultimately will, bear the relief. This step is typically accomplished through a transparent support layer and is used to create a shallow layer of photocured material, i.e., the "floor," on the support side of the photocurable layer. The purpose of the floor is generally to establish the depth of relief and establish greater support.

Following this brief exposure step (brief as compared to the imagewise exposure step which follows), an imagewise exposure is accomplished utilizing a photographic negative mask or a digitally-imaged mask, which is in contact with the photocurable layer and through which actinic radiation is directed.

The type of radiation used is dependent on the type of photoinitiator in the photopolymerizable layer. The photographic negative or digitally-imaged mask prevents the material beneath its opaque areas from being exposed to the actinic radiation and hence those areas covered by the opaque areas of the mask do not polymerize. The areas not covered by the opaque areas of the mask are exposed to actinic radiation and polymerize. Any conventional sources of actinic radiation can be used for this exposure step. Examples of suitable visible or UV sources include carbon arcs, mercury-vapor arcs, fluorescent lamps, electron flash units, electron beam units and photographic flood lamps.

Streamlining workflow is a huge desire of most print shop customers involved in the processing of photosensitive printing elements in order to provide more efficient and faster processing of the photosensitive printing elements and to increase productivity.

Furthermore, achieving consistent floors and back exposure times for flexographic printing elements, especially thin plates, is difficult for both print shop customers and printing plate manufacturers. After the manufacturer makes the printing plate blanks as described herein, the floor of the printing plate is set in the print shop by the print shop customer using back exposure. This back exposure is subject to variation due to many factors including UV-light source variation, temperature, age of the plates, and raw material variation, which can impact the consistency of the floor layer thus produced.

One of the difficulties print shops face in achieving consistent back exposure is described in U.S. Pat. No. 4,927,723 to Cusdin, the subject matter of which is herein incorporated by reference in its entirety. When preparing thin flexographic printing plates (e.g., 2 to 3 mm overall thickness), the cured floor thickness forms a substantial proportion of the thickness of the finished plate. The back exposure needed to produce the cured floor over the entire plate gives the appropriate floor depth in areas where the image-forming negative is predominantly transparent, but in small opaque areas of the negative, corresponding to "shadow reverses" of the printing plate, there is a tendency for the reverses to fill in because the back exposure operation tends to negate the effect of the masking of the fine opaque area of the negative and thus to cure the polymer in what should correspond to a small uncured zone of the printing plate. If the back exposure operation is correspondingly reduced in order to avoid this tendency, the stability of the highlight dots in other parts of the plate can be jeopardized through the formation of an excessively thin floor to the relief plate.

The '723 patent attempts to solve this problem by using a positive of the image as a mask for the back exposure step to ensure that, in those areas of the plate where delicate printing relief areas (for example highlight dots) are to arise, there is a substantial floor in order to stabilize the highlight dots, whereas in other areas of the plate (where the relief printing areas predominate) the floor thickness formed through back exposure is correspondingly reduced to preserve the openness of the fine uncured "shadow reverses" through the use of a part of the positive which is predominantly opaque as the mask for the back exposure operation. However, this process adds an additional step to the plate making process resulting in additional time to create the printing element.

The inventors of the present invention have determined that it would be highly desirable to streamline the workflow of the print shop customer while achieving more consistent floor layers in relief image printing elements. To that end, the inventors of the present invention have discovered that it is possible to produce a printing plate blank having a precured floor layer formed therein which is then delivered to the print shop customer for further processing.

Achieving a pre-cured floor eliminates a significant number of quality problems. Providing a pre-cured floor also allows the use of a simpler polyethylene terephthalate (PET) backing, without the need for an adhesive so long as the adhesion of the cured photopolymer on the "raw" PET would be sufficient.

Creating a plate with a pre-cured floor offers the print shop customer two potential benefits:

1) increased productivity due to elimination of a processing step because back exposure step is not required. Elimination of the back exposure step eliminates set-up, ongoing labor costs and periodic adjustment of the equipment for the print shop customer; and
2) extremely uniform and consistent floor layers in processed printing plates.

U.S. Pat. No. 6,759,175 to Daems et al., the subject matter of which is herein incorporated by reference in its entirety, describes a method for on-site preparation of a relief image comprising the steps of: (a) laminating a material comprising: a first peelable support, an image recording layer and an adhesive layer onto a UV-sensitive material comprising a support, an UV-sensitive layer, wherein the adhesive layer is laminated to the UV-sensitive layer; (b) image-wise exposing the image recording layer to form a mask; (c) flood exposing the UV-sensitive material through the mask; and (d) developing the UV-sensitive material. The peelable support is removed either before step (b), (c) or (d). As a result the extent of monomer diffusion from the UV-sensitive layer to the image recording layer is reduced and the adhesion between the image recording layer and the UV-sensitive material is optimized. However, Daems does not address the issue of variations in the floor layer and factors such as UV light source variation, temperature, and raw material variation are still an issue.

U.S. Patent Application Publication No. 2005/0015297 to Stebani et al., the subject matter of which is herein incorporated by reference in its entirety describes a method of marketing photopolymeric sleeves for flexographic printing in which a customer is supplied with a suitable apparatus and know-how for producing photopolymeric sleeves so that the customer is enabled to produce photopolymeric sleeves himself. However, Stebani et al. is limited to the production of printing sleeves and also does not address factors such as UV-light source variation, temperature, and raw material variation.

The advantage of the present invention lies in standardizing the floor layer thickness, which serves to prevent variation in the thickness of the floor. Another advantage lies in the cost savings to the customer, because the pre-cured floor layer enables the workflow to be accomplished more quickly by reducing a step in the process, and eliminating set-up, ongoing labor costs, and periodic adjustments associated with the back exposure step. Accordingly, less time and less machinery are required to produce the finished relief image printing element.

SUMMARY OF THE INVENTION

It is an object of the present invention to provide an improved method of manufacturing photocurable printing blanks such that the costs (and time) to both the manufacturer and the customer are reduced.

It is an other object of the present invention to provide printing plate blanks having a precured floor layer formed therein to print shop customers, thereby eliminating variations in the floor layer and enabling printing plates to be more quickly and efficiently produced.

To that end, the present invention is directed to an improved method of producing photosensitive printing plate blanks comprising the steps of:

a) forming a first photocurable layer on a backing sheet;
b) curing the first photocurable layer with actinic radiation to create a cured floor layer throughout the first photocurable layer; and
c) forming a second photocurable layer on top of the cured first photocured layer that is processible by actinic radiation to form a relief image printing element.

In another embodiment, the present invention is directed to a method of doing business in a manufacturing facility for photocurable printing blanks, whereby a time savings and improved product is realized by the manufacturing facility and its customers, the method comprising the steps of:

a) providing a photocurable printing blank to a customer, wherein the photocurable printing blank comprises precured photopolymer floor layer formed therein and an uncured photopolymer layer on top of the precured floor layer; and
b) providing instructions to the customer to eliminate a back-exposure step from the workflow process;

whereby a relief image printing element having a uniform and consistent floor is produced by the customer.

DETAILED DESCRIPTION OF THE PREFERRED EMBODIMENTS

The present invention is directed to an improved method of producing photosensitive printing plate blanks comprising the steps of:

a) forming a first photocurable layer on a backing sheet;

b) curing the first photocurable layer with actinic radiation to create a cured floor layer throughout the first photocurable layer; and c) forming a second photocurable layer on top of the cured first photocured layer that is processible by actinic radiation to form a relief image printing element.

In another embodiment, the present invention is directed to a method of doing business in a manufacturing facility for photocurable printing blanks, whereby a time savings and improved product is realized by the manufacturing facility and its customers, the method comprising the steps of:

a) providing a photocurable printing blank to a customer, wherein the photocurable printing blank comprises a precured floor photopolymer layer formed therein and an uncured photopolymer layer on top of the precured floor layer; and b) providing instructions to the customer to eliminate a back-exposure step from the workflow process;

whereby a relief image printing element having a uniform and consistent floor is produced by the customer.

The first photocurable layer is preferably formed by mixing the photocurable resin composition together and applying the resin composition between two flexible support layers. In the present invention, one flexible support is a backing sheet, which is preferably a flexible film such as polyethylene terephthalate, which may optionally bear a layer of adhesive material or primer or a release layer, such as silicone. Other suitable backing layers include polyimide films and flexible metal sheets and foils, e.g., steel or aluminum. The other flexible support is a release layer such as 27 SLK, available from Mitsubishi Polyester Film.

Figure 1:
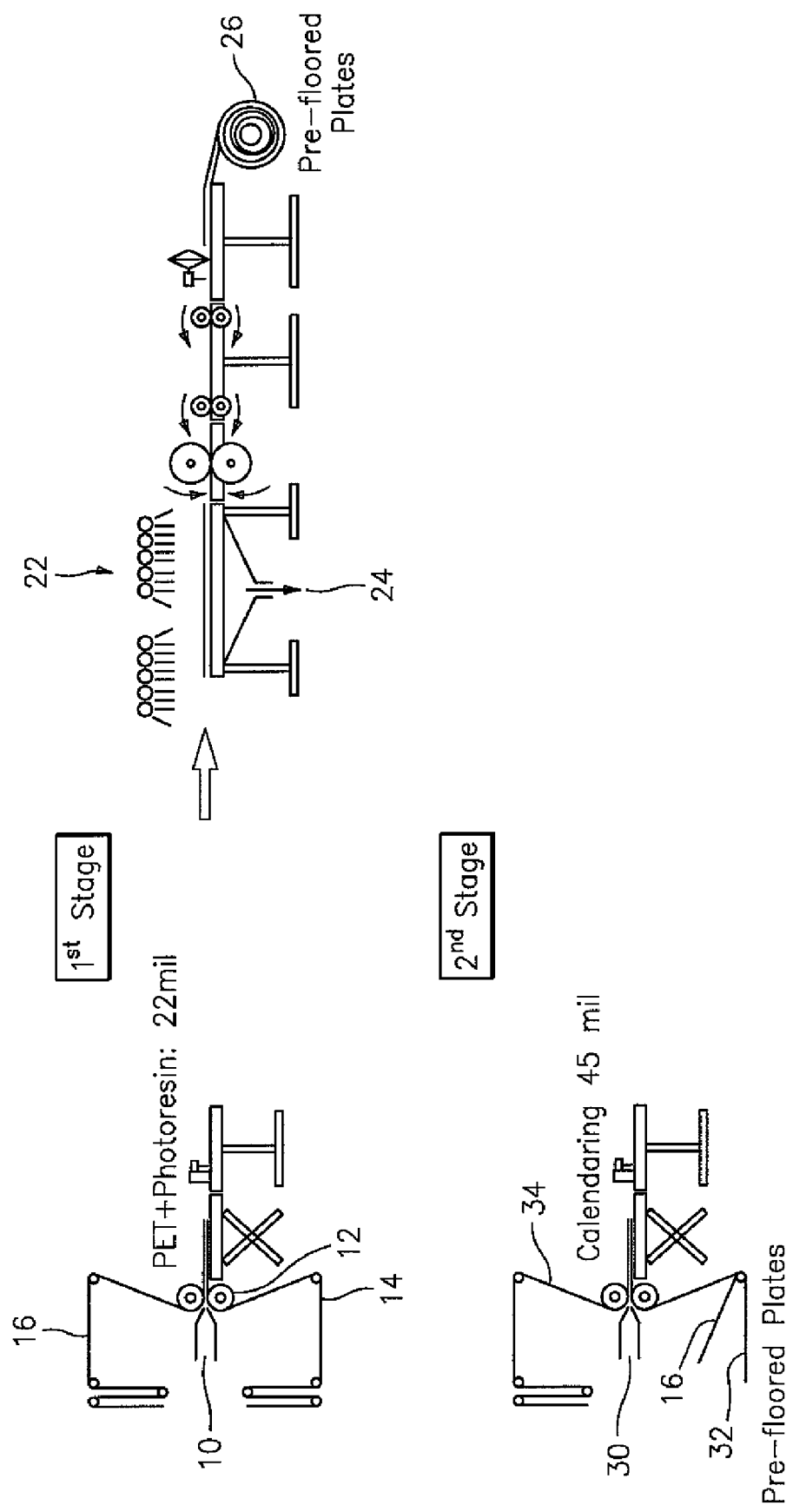
FIG. 1 depicts the steps in the novel process of the invention for manufacturing a photosensitive printing plate blank.

In one embodiment, the resin composition is mixed together in an extrusion die and is extruded into the nip of a calendar and calendared while hot between the two flexible support layers. As seen in FIG. 1, the composition is passed from the extruder 10 into the nip of a calendar 12 and the hot composition is calendared between the two flexible support layers 14 and 16. The photopolymer composition is preferably calendared to a thickness of about 22 mils for a thin plate and about 125 mils for a thick plate between the two flexible support layers, backing layer 14 and release layer 16. Alternatively, the photocurable resin composition can be placed between the two flexible support layers in a mold. The layers of material are then pressed flat by the application of heat and/or pressure.

In a preferred embodiment, one of the supports is a flexible film such as polyethylene terephthalate 14. The other support 16 is preferably a backing layer such as 27 SLK, available from Mitsubishi Polyester Film, that is easily stripped from the surface.

After the photopolymer element is prepared, as described above, the element is cooled. In a preferred embodiment the cooling steps involves exposure to ambient temperature. A further cooling step may follow, in which the photocurable layer is processed in a forced air cooling device 50 as is well known in the art.

Next, the photocurable layer is exposed to at least one source of actinic radiation 22 to crosslink and cure the first photocurable layer. In a preferred embodiment, the photocurable printing element is passed under a bank of UV lights, such as fluorescent lights. This exposure step preferably takes place under vacuum 24, as the UV lights 22 are arranged on a side of the photocurable printing element opposite the conveyor belt. Exposure of the photocurable layer to actinic radiation in a vacuum eliminates the presence of atmospheric oxygen and prevents oxygen from detrimentally affecting the polymerization reactions occurring in the photocurable layer. Polymerization reactions require long exposure times and high intensity radiation sources, and the results are less reproducible when oxygen is present. The pre-cured first photocurable layer may then be wound in a wind-up device 26.

Next, the second photocurable layer is formed on top of the precured first photocurable layer. The precured first photocurable layer is unwound and the release layer (such as 27SLK) is stripped from the surface. In a preferred embodiment, the second photocurable composition then extruded through a second extruder 30 onto the precured first photocurable layer 32 and is calendared between the first photocured layer 32 and a removable coversheet assembly 34. The second photopolymer composition and the first photocurable layer are preferably calendared to a thickness of about 45 mils for a thin plate and about 250 mils for a thick plate between the two layers. Thereafter the photocurable printing blanks with the precured floor layer may be cut to size and transported to a print shop customer to be subjected to further processing steps to produce relief image printing plates.

The coversheet assembly 34 may be a multi-layer coversheet as described, for example, in U.S. Pat. No. 4,427,759 to Gruetzmacher et al., the subject matter of which is herein incorporated by reference in its entirety.

Figure 2:
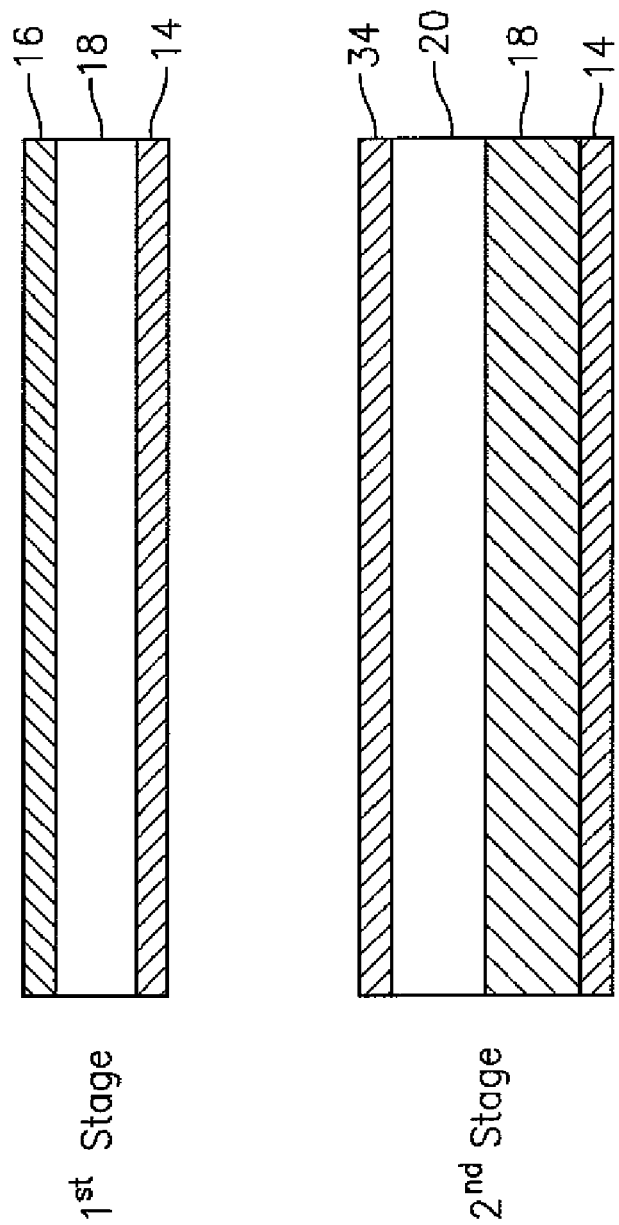
FIG. 2 depicts the various layers of a photosensitive printing plate blank prepared in accordance with the present invention.
Figure 3:
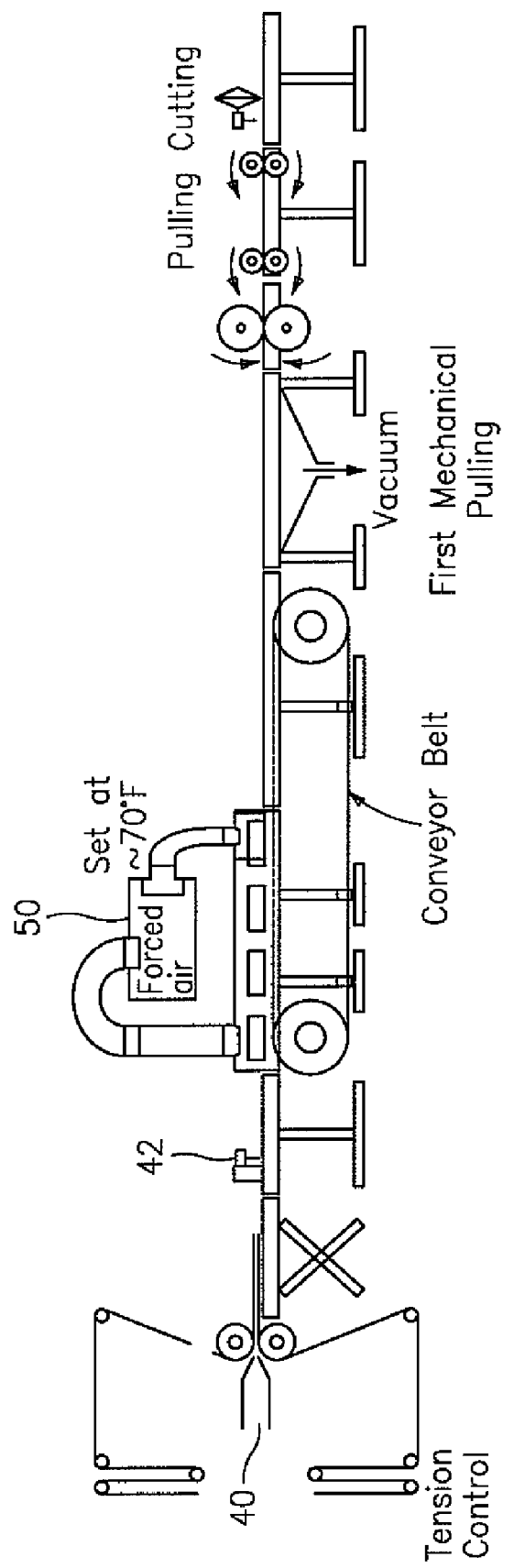
FIG. 3 depicts a typical prior art process for manufacturing photosensitive printing plate blanks.

As seen best in FIG. 2, in the $1^{st}$ stage, the printing plate blanks of the invention comprise:

a) a (polyethylene terephthalate) backing layer 14;
b) the first precured photocurable layer 18; and
c) a release layer 16.

In the $2^{nd}$ stage, the release layer 16 is removed, and the printing plate blanks comprise:

a) the (polyethylene terephthalate) backing layer 14;
b) the first precured photocurable layer 18;
c) a second photocurable layer 20; and
d) a coversheet assembly 34.

If desired, an adhesive layer may be used between the backing layer 14 and the first photocurable layer 18. However, one of the benefits of the present invention is that an adhesive layer is not necessary so long as the adhesion of the cured photocurable composition on the baking layer, preferably polyethylene terephthalate, is sufficient.

Both analog and digital plates may be prepared in accordance with the present invention as is generally well known in the art.

In some instances, it is desirable that the first photocurable layer and the second photocurable layer have different physical properties. For example, it may be preferable to form the first photocurable layer that is closest to the support layer have a composition that is readily deformable and resilient in the cured state to provide a greater conformity of the plate to the surface to be printed and provide a more even impression. In addition, it may be preferable to form the second photocurable layer which provides the printing surface with a composition that has been specifically adapted to provide improved printing characteristics, including ink take-up and lay-down, abrasion resistance, solvent resistance and the like.

What is claimed is:

1. A method of doing business in a manufacturing facility for photocurable printing blanks, whereby a time savings and improved product is realized by the manufacturing facility and its customers, the method comprising the steps of:

a) preparing a photocurable printing blank at a manufacturing facility by a process comprising the steps of:
  i) forming a first photocurable layer on a backing sheet;
  ii) curing the first photocurable layer with actinic radiation to form a cured floor layer; and iii) forming a second photocurable layer on top of the cured floor layer, wherein said second photocurable layer is capable of being cured by actinic radiation to form a relief image therein;

b) providing instructions to the consumer to establish a process at the customer's facility for producing a relief image printing element, wherein the process includes the steps of front-exposure of the photocurable printing blank and developing the photocurable printing blank to create the relief image printing element but does not include a back exposure step;

c) providing the photocurable printing blank having the cured floor layer formed therein to the customer, wherein the customer performs steps to front-expose and develop the second photocurable layer of the printing plate blank to form the relief image in the second photocurable layer but does not back expose the photocurable printing blank.

2. The business method of claim 1, wherein the backing layer comprises polyethylene terephthalate.

3. The business method of claim 2, wherein the first photocurable layer is deposited on the backing layer without the use of an adhesive.

4. The business method of claim 1, wherein the customer is provided with options for ordering printing blanks of a desired size and thickness.

5. The business method of claim 1, wherein the step of curing the first photocurable layer with actinic radiation is performed under vacuum.

* * * * *